United States Patent [19]

Shiobara et al.

[11] Patent Number: 6,143,423
[45] Date of Patent: Nov. 7, 2000

[54] FLAME RETARDANT EPOXY RESIN COMPOSITIONS

[75] Inventors: Toshio Shiobara; Satoshi Okuse; Takayuki Aoki; Hideto Kato, all of Usui-gun, Japan

[73] Assignee: Shin-Etsu Chemical Co., Ltd., Japan

[21] Appl. No.: 09/055,301

[22] Filed: Apr. 6, 1998

[30] Foreign Application Priority Data

Apr. 7, 1997 [JP] Japan ..................... 9-103959

[51] Int. Cl.⁷ .................................... H01L 29/12
[52] U.S. Cl. .................. 428/620; 525/420; 525/423; 525/449; 525/481
[58] Field of Search .................. 525/420, 423, 525/449, 481; 428/620

[56] References Cited

U.S. PATENT DOCUMENTS

| | | | |
|---|---|---|---|
| 5,284,938 | 2/1994 | Dangayach et al. | 523/457 |
| 5,358,980 | 10/1994 | Shiobara et al. | 523/427 |
| 5,780,571 | 7/1998 | Ohno et al. | 528/97 |
| 5,827,908 | 10/1998 | Arai et al. | 523/212 |

FOREIGN PATENT DOCUMENTS

| | | |
|---|---|---|
| 739877 | 10/1996 | European Pat. Off. . |
| 63-95249 | 4/1988 | Japan . |
| 63-101454 | 5/1988 | Japan . |
| 63-117057 | 5/1988 | Japan . |
| 63-275661 | 11/1988 | Japan . |
| 63-312349 | 12/1988 | Japan . |

*Primary Examiner*—Robert Dawson
*Assistant Examiner*—D. Aylward
*Attorney, Agent, or Firm*—Millen, White, Zelano, & Branigan, P.C.

[57] ABSTRACT

An epoxy resin composition contains (A) an epoxy resin having an epoxy equivalent of at least 185 and possessing a skeleton having a structure in which two benzene rings are conjugable to each other directly or via an aliphatic unsaturated double bond, carbon atoms having an atomic orbital of $SP^2$ type accounting for at least 50% of the carbon number, (B) a phenolic resin having a hydroxyl equivalent of at least 160, carbon atoms having an atomic orbital of $Sp^2$ type accounting for at least 85% of the carbon number, (C) a polyimide resin in an amount of 1–20 parts by weight per 100 parts by weight of components (A) and (B) combined, and (D) 70–85% by volume of the entire composition of an inorganic filler. The composition cures into products having flame retardancy and high-temperature reliability even though it is free of bromine compounds and antimony compounds.

20 Claims, No Drawings

FLAME RETARDANT EPOXY RESIN COMPOSITIONS

BACKGROUND OF THE INVENTION

1. Field of the Invention

This invention relates to epoxy resin compositions which are so flame retardant and high-temperature reliable that they are useful for semiconductor encapsulation.

2. Prior Art

Heretofore, epoxy resin compositions have been widely used as semiconductor encapsulants. The advanced high-speed devices release greater amounts of heat so that the packages themselves become hot, giving rise to a reliability problem. On the other hand, to improve solder reflow resistance, encapsulating resins having a glass transition temperature of about 100° C. are now employed as the encapsulant. Under the circumstances, it now becomes an important task in the semiconductor industry how to maintain encapsulants reliable at high temperatures.

The most serious trouble arising at high temperatures is that bromine compounds or antimony compounds blended in encapsulants as the flame retardant are decomposed at high temperatures to incur reaction at connections between gold wires and aluminum whereby the connections increase their resistance and are sometimes broken. This trouble becomes more serious when materials having low glass transition temperatures are used as the encapsulant.

SUMMARY OF THE INVENTION

Therefore, an object of the invention is to provide a novel and improved flame retardant epoxy resin composition which is highly flame retardant in the absence of bromine compounds and antimony compounds and remains highly reliable at high temperature so that it is suitable for semiconductor encapsulation.

The present invention provides a flame retardant epoxy resin composition comprising (A) an epoxy resin having an epoxy equivalent of at least 185 and possessing a skeleton having in its molecular structure at least one structure in which two benzene rings are conjugable to each other directly or via an aliphatic unsaturated double bond, carbon atoms having an atomic orbital of $SP^2$ type accounting for at least 50% of the carbon number, (B) a phenolic resin having a hydroxyl equivalent of at least 160, carbon atoms having an atomic orbital of $SP^2$ type accounting for at least 85% of the carbon number, (C) a polyimide resin in an amount of 1 to 20 parts by weight per 100 parts by weight of components (A) and (B) combined, and (D) at least 70% by volume of the entire composition of an inorganic filler.

The composition is substantially free of bromine compounds and antimony compounds. The composition is highly flame retardant even in the absence of bromine compounds and antimony compounds, remains highly reliable at high temperature, and is well suited for semiconductor encapsulation.

In addition to components (A) to (D), the flame retardant epoxy resin composition may further contain (E) an organopolysiloxane of the following average compositional formula (1):

$$R^1{}_a SIO_{(4-a)/2} \quad (1)$$

wherein $R^1$ is substituted or unsubstituted monovalent hydrocarbon group and letter a is a positive number of from 1 to 3, or a cured product thereof, in an amount of 0.1 to 10 parts by weight per 100 parts by weight of components (A), (B), and (C) combined. The organopolysiloxane (E) cooperates with the polyimide resin (C) to provide a synergistic effect of enhancing flame retardance.

Making investigations to render epoxy resins flame retardant without using bromine compounds and antimony compounds, we have found that the combustion of cured epoxy resin depends on the amount of a linkage of the following structure:

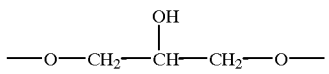

produced by ring-opening reaction of glycidyl groups with phenolic hydroxyl groups; that the combustion of cured epoxy resin is affected by the quantities of carbon having an atomic orbital of $SP^2$ type in the epoxy resin and the phenolic resin; and that flame retardance is accomplished by using components (A) and (B) defined above as the epoxy resin and the phenolic resin, blending the polyimide resin and the inorganic filler defined above in specific amounts, and optionally blending the organopolysiloxane defined above.

DETAILED DESCRIPTION OF THE INVENTION

The flame retardant epoxy resin composition of the invention is defined as comprising:

(A) an epoxy resin,
(B) a phenolic resin,
(C) a polyimide resin, and
(D) an inorganic filler as essential components, and preferably
(E) an organopolysiloxane or a cured product thereof.

Component (A) is an epoxy resin having at least two epoxy groups in a molecule and an epoxy equivalent of at least 185. The epoxy resin possesses a skeleton having in its molecular structure at least one structure in which two benzene rings are conjugable to each other directly or via an aliphatic unsaturated double bond. Carbon atoms having an atomic orbital of $SP^2$ type account for at least 50% of the carbon number of the epoxy resin. Any type of epoxy resin may be used insofar as it satisfies the above requirements.

The structure constituting the epoxy resin skeleton and having two benzene rings conjugable to each other is typically a biphenyl structure, a naphthalene ring or benzene rings connected by an aliphatic unsaturated carbon-to-carbon double bond (represented by —CH=CH—, throughout the disclosure). With such a conjugated structure incorporated into an epoxy resin, a cured epoxy resin product becomes resistant to oxidation upon combustion. At least 50%, generally 50 to 99%, preferably 54 to 95%, more preferably 57 to 90% of the number of carbon atoms in the epoxy resin are carbon atoms having an atomic orbital of $SP^2$ type.

Conversely, epoxy resins which are free of conjugated benzene rings in their skeleton or contain less than 50% of carbon atoms having an atomic orbital of $SP^2$ type are susceptible to pyrolysis at high temperatures, generating gases and continuing combustion. We have empirically found that epoxy resins which have conjugated benzene rings in their skeleton and contain at least 50%, generally 50 to 99%, preferably 54 to 95%, more preferably 57 to 90% of carbon atoms having an atomic orbital of $SP^2$ type are effective for restraining the propagation of a flame. These epoxy resins should have an epoxy equivalent of at least 185, generally 185 to 1,000 in order to minimize the density of aliphatic bonds created by bonding with phenolic hydroxyl groups. With an epoxy equivalent of less than 185, the density of aliphatic bonds created through reaction becomes high enough to continue combustion, failing to achieve the objects of the invention.

Epoxy resins of the following structures are given as typical examples.

If desired, any of well-known epoxy resins having at least two epoxy groups per molecule may be blended in the inventive composition along with the above-defined epoxy resin (A) insofar as flame retardance is not adversely affected. Such additional epoxy resins are, for example, bisphenol A type epoxy resins, bisphenol F type epoxy resins, phenol novolak type epoxy resins, cresol novolak type epoxy resins, naphthalene type epoxy resins, biphenyl type epoxy resins, and cyclopentadiene type epoxy resins, which do not satisfy all the requirements of epoxy resin (A).

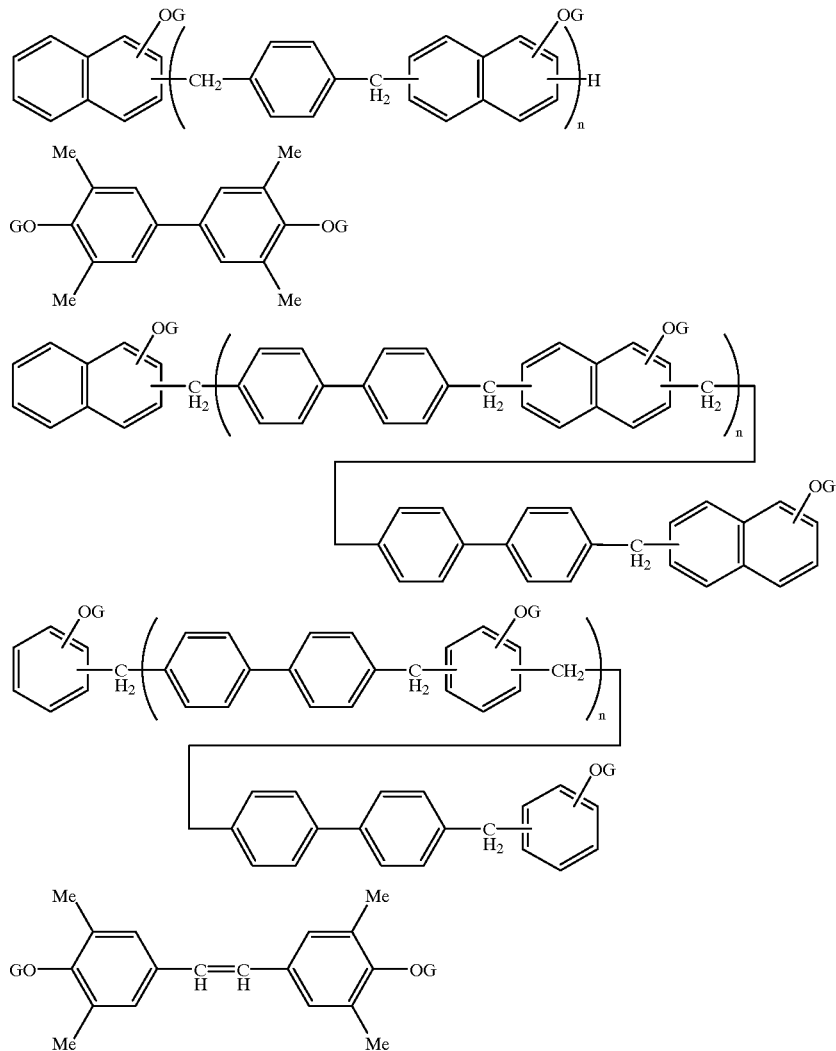

It is noted that G stands for a glycidyl group, Me stands for a methyl group, and n is 0 or a positive number such that the resin may have an epoxy equivalent of 185 to 1,000.

Of these epoxy resins, the naphthalene type epoxy resins and biphenyl type epoxy resins are desirable as well as those resins having the following liquid crystal structures.

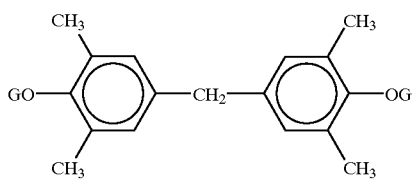

-continued

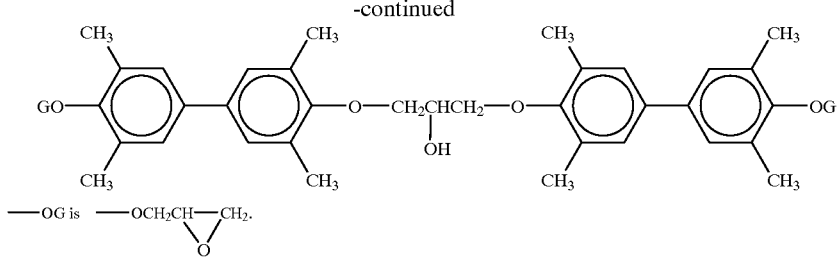

The additional epoxy resin other than component (A) may be blended in an amount of up to 30% by weight, preferably 0 to about 20%, more preferably 0 to about 10% by weight of the overall epoxy resins in the composition.

The epoxy resin or resins should desirably have a total chlorine content of 1,500 ppm or less, more desirably 1,000 ppm or less. When chlorine is extracted from the epoxy resin with water at 120° C. and an epoxy resin concentration of 50% by weight over a period of 20 hours, the water-extracted chlorine content is preferably 5 ppm or less. A total chlorine content in excess of about 1,500 ppm or a water-extracted chlorine content of more than about 5 ppm can be detrimental to the moisture-resistant reliability of semiconductors.

Component (B) of the composition according to the invention is a phenolic resin having at least two phenolic hydroxyl groups in a molecule and a hydroxyl equivalent of at least 160, generally 160 to 1,000, preferably 190 to 500. Carbon atoms having an atomic orbital of $SP^2$ type account for at least 85% of the carbon number of the phenolic resin. Since flame retardance is largely affected by the structure of phenolic resin rather than that of epoxy resin, the phenolic resin must contain at least 85% (i.e., 85 to 100%) of carbon atoms having an atomic orbital of $SP^2$ type, generally 85 to 99%, especially 90 to 95% of carbon atoms having an atomic orbital of $SP^2$ type. Less than 85% of carbon atoms having an atomic orbital of $SP^2$ type means that there are a more number of highly combustible carbon atoms, allowing easy propagation of a flame. In order to restrain combustion, the hydroxyl equivalent of the phenolic resin must also be controlled like the epoxy equivalent of the epoxy resin. For flame retardance, the phenolic resin should have a hydroxyl equivalent of at least 160, generally 160 to 1,000, preferably 190 to 500, more preferably 195 to 400. With a hydroxyl equivalent of less than 160, a more quantity of bonds created through reaction with epoxy groups is available so that the composition becomes combustible.

Any desired phenolic resin may be used insofar as it has a hydroxyl equivalent of at least 160, preferably at least 190 and contains at least 85% of carbon atoms having an atomic orbital of $SP^2$ type. Phenolic resins of the following structures are given as typical examples.

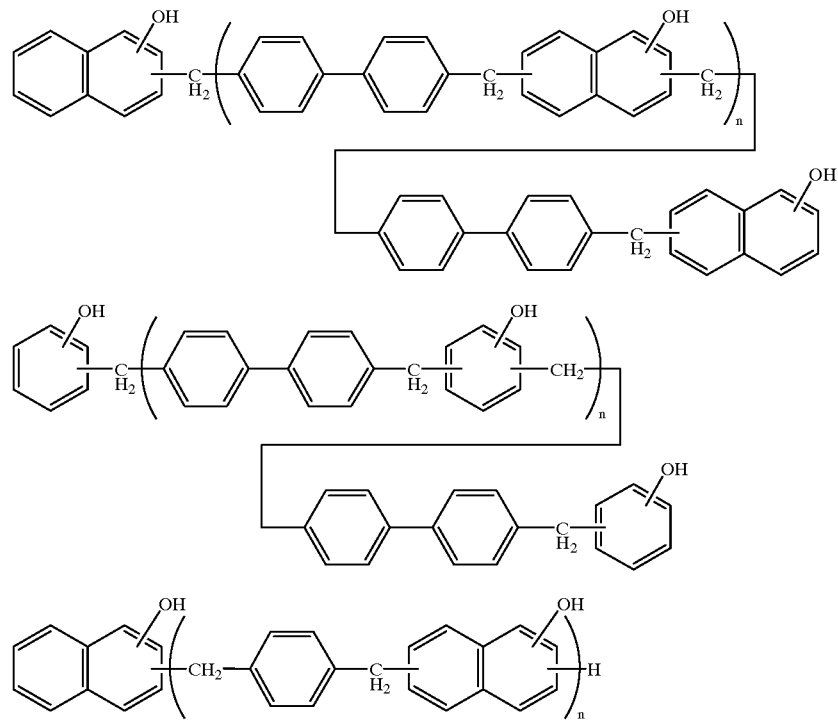

-continued

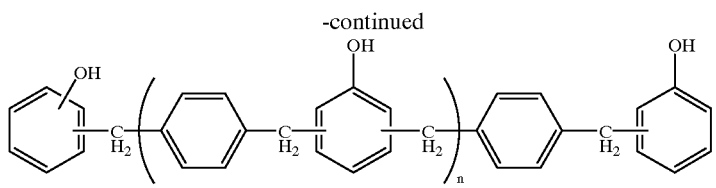

It is noted that n is 0 or a positive number such that the resin may have a phenolic hydroxyl equivalent of at least 160, preferably 160 to 1,000.

If desired, any of well-known phenolic resins having at least two phenolic hydroxyl groups per molecule may be blended in the inventive composition along with the above-defined phenolic resin (B) insofar as flame retardance is not adversely affected. Such additional phenolic resins are, for example, phenol novolak resins, cresol novolak resins, and phenol aralkyl resins.

The additional phenolic resin other than component (B) may be blended in an amount of up to 20% by weight, preferably 0 to about 10%, more preferably 0 to about 5% by weight of the overall phenolic resins in the composition.

Like the epoxy resins, when these phenolic resins are extracted with water at 120° C., the concentrations of extracted ions such as chloride ions and sodium ions are preferably each 10 ppm or less, and more preferably 5 ppm or less.

The mixing ratio of the epoxy resin(s) and the phenolic resin(s) is preferably such that about 0.6 to 1.3 mol, more preferably about 0.7 to 1.1 mol, especially about 0.8 to 1.0 mol of epoxy groups are available per mol of phenolic hydroxyl groups. With less than 0.6 mol of epoxy groups on this basis, the crosslinking density would be too low to provide strength, and more phenolic hydroxyl groups would be left to detract from damp-proof reliability and high-temperature reliability. On the other than, a mixing ratio in excess of 1.3 mol of epoxy groups would result in a lower crosslinking density, a lower glass transition temperature, a higher proportion of residual epoxy groups, and a higher proportion of aliphatic bonds created through reaction, which would adversely affect flame retardance.

In the practice of the invention, phosphorus compounds, imidazole derivatives and cycloamidine derivatives may be used as a curing promoter. The curing promoter is preferably blended in an amount of about 0.01 to 10 parts by weight per 100 parts by weight of the amount of the epoxy resin and the phenolic resin combined.

For improving flame retardance, a polyimide resin is blended as component (C) in the epoxy resin composition of the invention. The polyimide resins used herein include polyimide resins and polyamide-imide resins although polyimide resins comprising a polymer of the following general formula (2) as main constituent units and polyamide-imide resins comprising a polymer of the following general formula (3) as main constituent units are preferred, with the former being more preferred.

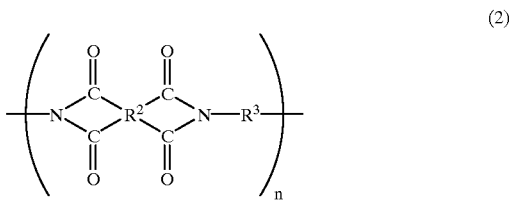

(2)

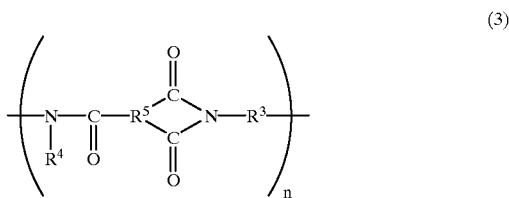

(3)

In the formulae, n is at least 1, preferably such a number that the resin may have a weight average molecular weight of about 5,000 to about 300,000.

$R^2$ is a tetracarboxylic acid dianhydride residue in which two acid anhydride groups (i.e., $(-CO)_2O$ groups) are excluded from a tetracarboxylic acid dianhydride, and hence a tetravalent organic group having at least two carbon atoms. In view of the heat resistance of the polyimide polymer, $R^2$ should preferably have a structure that allows an aromatic ring or aromatic heterocyclic ring to directly bond with carbonyl groups in the polymer backbone. That is, $R^2$ is preferably a tetravalent organic group of 6 to 30 carbon atoms containing an aromatic ring(s) or aromatic heterocyclic ring(s). Preferred illustrative examples of $R^2$ are given below although it is not limited thereto.

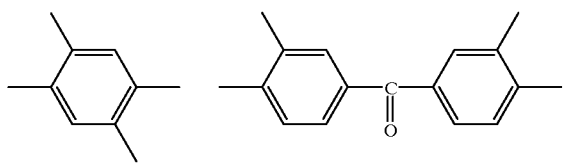

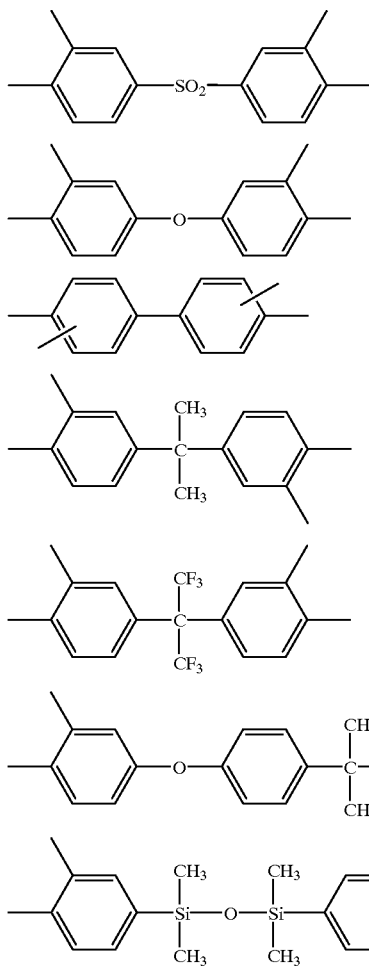

In the formulae, bond symbols "–" represent bonds to carbonyl groups of the acid anhydride residues in the polymer backbone, and the CO groups are at the ortho-position relative to the carbon atom at the other end of the bond symbols.

The polyimide resin may be a homopolymer of formula (2) wherein $R^2$ is one of the above-mentioned groups or a copolymer of formula (2) wherein $R^2$ is a mixture of the above-mentioned groups.

Especially preferred examples of $R^2$ are given below.

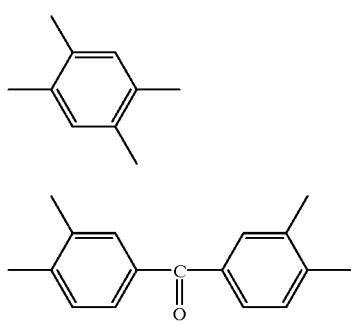

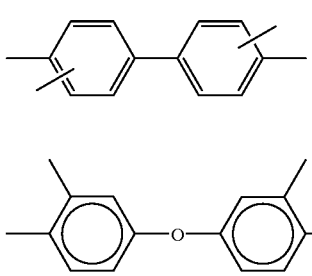

In formulae (2) and (3), $R^3$ is a diamine residue in which two amino groups are excluded from a diamine, and hence a divalent organic group having at least two carbon atoms. In view of the heat resistance of the polyimide polymer, $R^3$ should preferably have a structure that allows an aromatic ring to directly bond with the amide group and/or imide group in the polymer backbone. That is, $R^3$ is preferably a divalent organic group of 6 to 30 carbon atoms containing an aromatic ring(s). Preferred illustrative examples of $R^3$ are given below although it is not limited thereto.

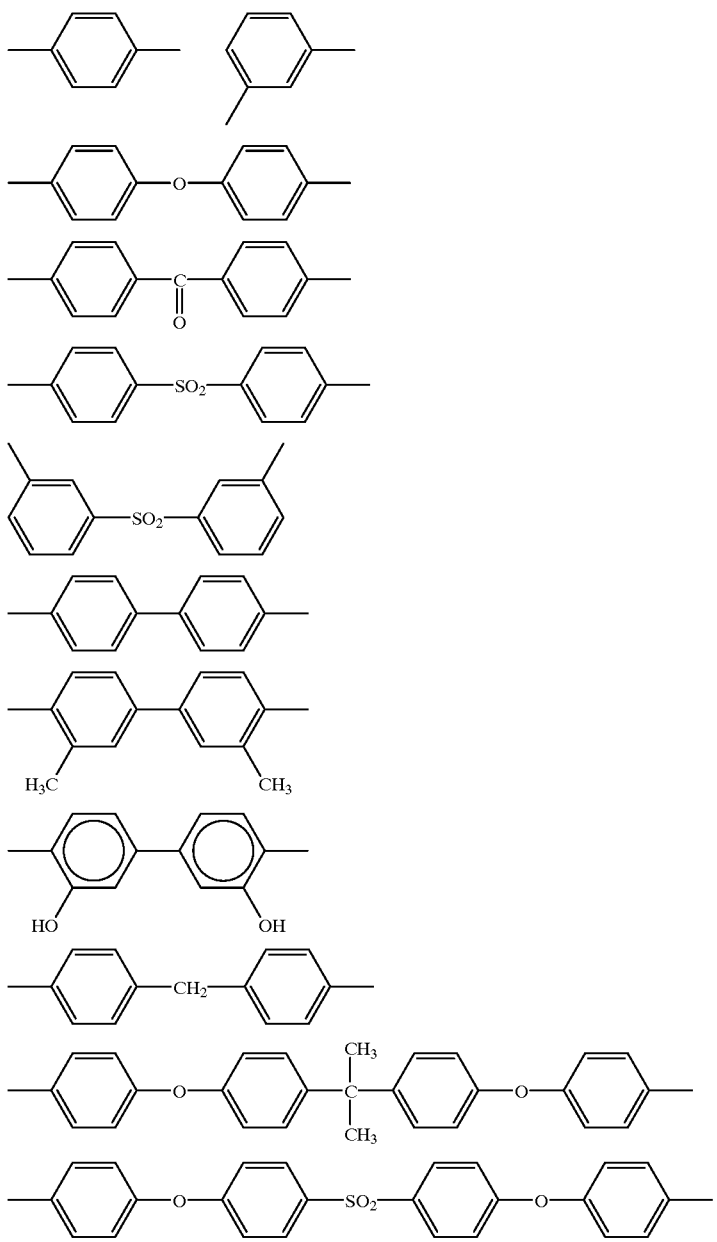

The polyimide resin may be a homopolymer of formula (2) or (3) wherein $R^3$ is one of the above-mentioned groups or a copolymer of formula (2) or (3) wherein $R^3$ is a mixture of the above-mentioned groups.

Especially preferred examples of $R^3$ are given below.

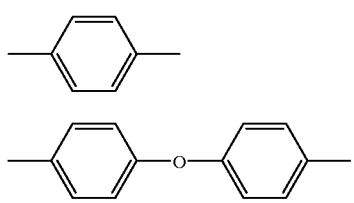

-continued

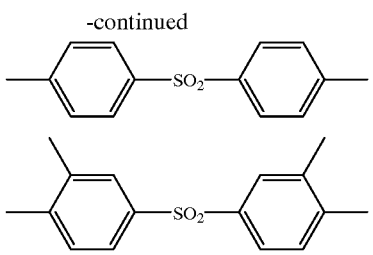

In formula (3), $R^4$ is a hydrogen atom or an alkyl group of 1 to 4 carbon atoms such as methyl, ethyl, propyl, isopropyl, butyl or tert-butyl.

In formula (3), $R^5$ is a tricarboxylic acid monoanhydride or its ester compound residue in which one acid anhydride group and one carboxyl group or its ester group are excluded from a tricarboxylic acid monoanhydride or its ester compound, and hence a trivalent organic group of 6 to 20 carbon atoms, preferably 6 to 10 carbon atoms, containing an aromatic ring(s) or aromatic heterocyclic ring(s). Preferred illustrative examples of $R^5$ are given below although it is not limited thereto.

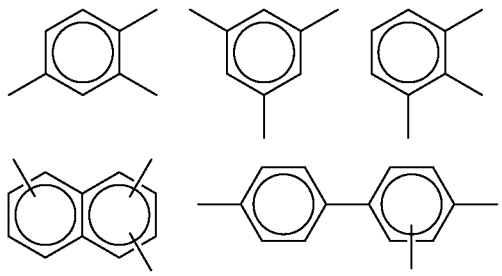

While the polyimide resin of formula (2) or (3) is added to the epoxy resin, the polyimide resin may be copolymerized with an aliphatic diamine having a siloxane structure or an amino functional group-bearing alkoxysilane such as γ-aminopropyltriethoxysilane may be added for the purpose of improving the adhesion of the epoxy resin composition to silicon chips or lead frames, but in an amount that will not adversely affect the heat resistance of the epoxy resin composition.

Preferred illustrative examples of the aliphatic diamine having a siloxane structure are given below.

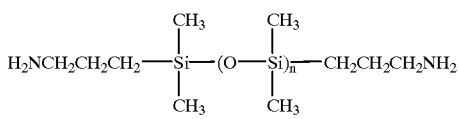

Note: n is an integer of 1 to 100.

The amount of the aliphatic diamine having a siloxane structure copolymerized is generally up to 30 mol %, preferably 0 to 10 mol %, more preferably 0 to 5 mol %, especially 1 to 3 mol % of the diamine component represented by $H_2N-R^3-NH_2$ ($R^3$ is the same meaning as above) which is a starting material for synthesizing a polyimide of formula (2) or (3) shown above, when heat resistance is taken into account. The amount of the aminosilane added is preferably 0 to 10% by weight, especially 0.5 to 5% by weight of the polyimide resin.

The polyimide resins used herein are preferably adjusted to a softening point of 170 to 300° C. by controlling the degree of polymerization and the composition of starting reactants. With respect to molecular weight, the polyimide resins preferably have a weight average molecular weight of about 5,000 to about 300,000. The form of the polyimide resin may widely vary from powder to varnish dissolved in polar solvent and any of them may be used. The polyimide resin is added to the epoxy resin composition by various methods, for example, by finely dividing the polyimide resin, mixing with the remaining components of the epoxy resin composition and uniformly milling the mixture, or by melting the polyimide resin together with the epoxy resin and phenolic resin for mixing them, or by dissolving and mixing these components in a solvent and distilling off the solvent. The addition method is not critical.

The amount of the polyimide resin added is about 1 to 20 parts, desirably about 3 to 10 parts by weight per 100 parts by weight of the epoxy resin (A) and the phenolic resin (B) combined. Less than 1 part of the polyimide resin on this basis is too small to suppress combustion of the epoxy resin composition and less effective for improving adhesion. More than 20 parts of the polyimide resin achieves sufficient combustion suppression, but provides a too viscous composition which will cause deformation of gold wires and short filling upon molding.

Component (D) in the epoxy resin composition of the present invention is an inorganic filler. The inorganic filler used herein may be selected from among fused silica which has been ground in a ball mill, for instance, spherical silica obtained by flame fusion, spherical silica produced by a sol-gel process, crystalline silica, alumina, boron nitride, aluminum nitride, silicon nitride, magnesia and magnesium silicate. If the semiconductor device generates an amount of heat, fillers having a higher thermal conductivity and a lower coefficient of thermal expansion, such as aluminum, boron nitride, aluminum nitride and silicon nitride, are preferred. These fillers may also be used as a blend with fused-silica or the like.

Epoxy resin compositions having a melt viscosity of less than about 200 poises at 175° C., and especially less than about 100 poises at 175° C., are appropriate for encapsulating microelectronic devices. To this end, the inorganic filler is preferably spherical and has a particle size distribution which allows the closest possible packing. It is also desirable for the inorganic filler have a particle size distribution such that the average particle size (as a weight average based on the laser diffraction technique, for example) is about 4 to 30 μm, fine particles with a diameter of 3 μm or less account for 10 to 40% by weight of the filler, and the maximum particle size is not more than 74 μm, and more preferably not more than 50 μm, as well as a specific surface area of not more than 3.0 m²/g, and more preferably about 1.0 to 2.5 m²/g.

A fine filler having a mean particle size of 0.5 μm or less plays the important role in reducing the viscosity and controlling the flow of the resin composition because such a fine filler enables closest packing and imparts thixotropy. It is thus preferred to blend a fine filler having a mean particle size of 0.5 μm or less, more preferably 0.05 to 0.3 μm. Such fine filler particles are desirably spherical and have a specific surface area of 10 to 50 m²/g. More desirably, the filler has a specific surface area of 15 to 40 m²/g.

It is noted that ultra-microparticulate silica such as aerosil may be added for imparting thixotropy. Where ultra-microparticulate silica is used, it is recommended to premix the silica with another filler in a mixer such as a ball mill and to add the resulting uniform premix to other components.

The fine filler having a mean particle size of up to 0.5 μm may be blended in an amount of not more than 10% by weight, more preferably about 0.5 to 10% by weight, most preferably about 1 to 7% by weight of the total weight of inorganic fillers.

The amount of the inorganic filler used must be 70% by volume or higher based on the entire resin composition. Less than 70% by volume of the inorganic filler means that the composition contains a higher proportion of resins to allow the cured product to continue burning. An appropriate amount of the inorganic filler used is 70% to 85% by volume. An inorganic filler content in excess of 85% by volume may make the composition so viscous as to obstruct molding.

In one preferred embodiment, the epoxy resin composition of the invention further contains (E) an organopolysiloxane or a cured product thereof in addition to components (A) to (D) whereby flame retardancy is further improved.

The manner of the organopolysiloxane or cured product exerting a flame retardant effect is explained as follows. By burning, an organopolysiloxane or cured product is decomposed into carbon dioxide, carbon monoxide, and waters and leaves silica ($SiO_2$) as ash. In general, the burning state of an organopolysiloxane or cured product is distinguished from other oils, typically mineral oils by a smaller amount of gases given off and less combustion heat which leads to a smaller flame and retards flame propagation to the surroundings.

The organopolysiloxane used herein is of the following average compositional formula (1):

wherein $R^1$ is a substituted or unsubstituted monovalent hydrocarbon group and letter a is a positive number: $1 \leq a \leq 3$.

More particularly, in formula (1), $R^1$ is a substituted or unsubstituted monovalent hydrocarbon group. Examples of the unsubstituted monovalent hydrocarbon group represented by $R^1$ include alkyl groups of 1 to 10 carbon atoms, preferably 1 to 6 carbon atoms, such as methyl, ethyl, propyl, butyl, pentyl, hexyl, cyclohexyl, and octyl, alkenyl groups such as vinyl, allyl, propenyl, and butenyl, aryl groups such as phenyl, tolyl, and naphthyl, and aralkyl groups such as benzyl and phenylethyl. Examples of the substituted monovalent hydrocarbon group represented by $R^1$ include those of the foregoing hydrocarbon groups wherein some or all of the hydrogen atoms are replaced by halogen atoms such as fluorine or cyano groups, as well as monovalent hydrocarbon groups having a functional group or groups selected from amino groups, epoxy groups, carboxyl groups, carbinol groups, (methyl)styryl groups, (meth)acryl groups, mercapto groups, polyether groups, higher fatty acid ester groups, and long chain alkyl groups of at least 12 carbon atoms. These functional groups are attached to the silicon atom through an unsubstituted or hydroxy-substituted alkylene or arylene group of about 2 to 10 carbon atoms, especially about 3 to 8 carbon atoms, which may be separated by an intervening oxygen atom or imino (—NH—) group, or an alkylene-arylene group as a combination thereof.

Letter a is a positive number in the range: $1 \leq a \leq 3$, preferably $1.5 \leq a \leq 2.5$.

The organopolysiloxane compounds of the average compositional formula (1) are classified into the following classes in terms of their structure.

Nonfunctional organopolysiloxane compounds which do not have any functional group-substituted monovalent hydrocarbon groups in a molecule include dimethylpolysiloxane and methylphenylpolysiloxane.

Modified organopolysiloxane compounds include amino-modified organopolysiloxanes, epoxy-modified organopolysiloxanes, carboxyl-modified organopolysiloxanes, carbinol-modified organopolysiloxanes, (meth)acryl-modified organopolysiloxanes, mercapto-modified organopolysiloxanes, phenol-modified organopolysiloxanes, one end reactive organopolysiloxanes, organopolysiloxanes modified with different functional groups, polyether-modified organopolysiloxanes, methylstyryl-modified organopolysiloxanes, long chain alkyl-modified organopolysiloxanes, higher fatty acid ester-modified organopolysiloxanes, higher fatty acid-containing organopolysiloxanes, and fluorine-modified organopolysiloxanes such as trifluoropropylmethylpolysiloxane.

The molecular structure of the nonfunctional organopolysiloxane compounds and modified organopolysiloxane compounds may be straight, cyclic or branched.

Organopolysiloxane resins are further divided into methylpolysiloxane resins and methylphenylpolysiloxane resins, with those resins having a carbon-to-carbon double bond in their structure being known to be more flame retardant. The methylpolysiloxane resins used herein include copolymers of three-dimensional network structure comprising a combination of $SiO_2$, $CH_3SiO_{3/2}$, $(CH_3)_2SiO$, and/or $(CH_3)_3SiO_{1/2}$ structural units. The methylphenylpolysiloxane resins used herein include copolymers of three-dimensional network structure comprising a combination of $SiO_2$, $CH_3SiO_{3/2}$, $C_6H_5SiO_{3/2}$, $(CH_3)_2SiO$, $(C_6H_5)_3SiO_{1/2}$, $(CH_3)_3SiO_{1/2}$, $(CH_6H_5)(CH_3)SiO$, and/or $(C_6H_5)_2SiO$ structural units. They are more heat resistant than the methylpolysiloxane resins.

The organopolysiloxane compounds of the average compositional formula (1) should preferably have a degree of polymerization of about 5 to about 1,000, more preferably about 10 to about 200. The degree of polymerization is the number of silicon atoms in a molecule. An organopolysiloxane with a degree of polymerization of less than 5 has a too low molecular weight and would give rise to the problems of volatility and compatibility. An organopolysiloxane with a degree of polymerization of more than 1,000 is too viscous and less dispersible.

Of these organopolysiloxanes, dimethylpolysiloxanes having a higher content of silicon atoms and organohydrogenpolysiloxane compounds having a silicon-to-hydrogen bond (i.e., SiH group) are especially desirable.

From the standpoints of package surface marking, adhesion, and the compatibility between the matrix resin and the organopolysiloxane compound, polyether-modified organopolysiloxane compounds having a polyether group providing high affinity to the matrix resin are preferably used. Preferred examples of the polyether-modified organopolysiloxane compound are given below.

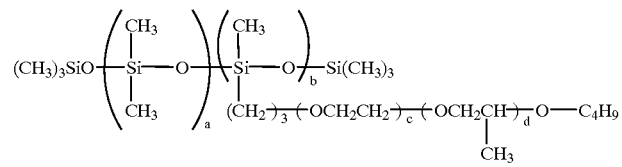

-continued
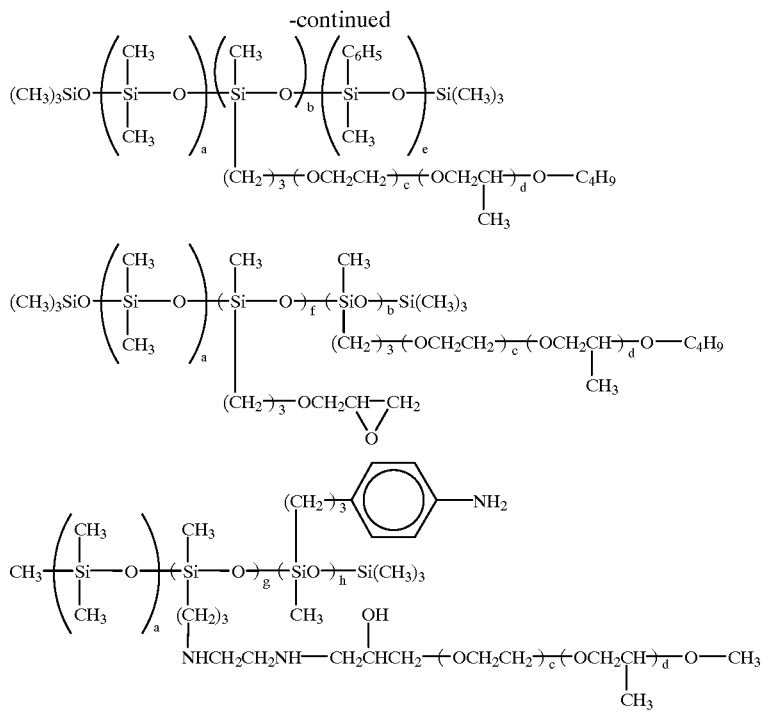
In the above formulae, letters a to h are integers, a is from 5 to 200, b is from 1 to 5, c is from 0 to 30, d is from 0 to 30, c+d is from 10 to 60, e is from 1 to 50, f is from 1 to 5, g is from 1 to 5, and h is from 0 to 5.
More illustrative, preferred examples of the polyether-modified organopolysiloxane compound are given below.
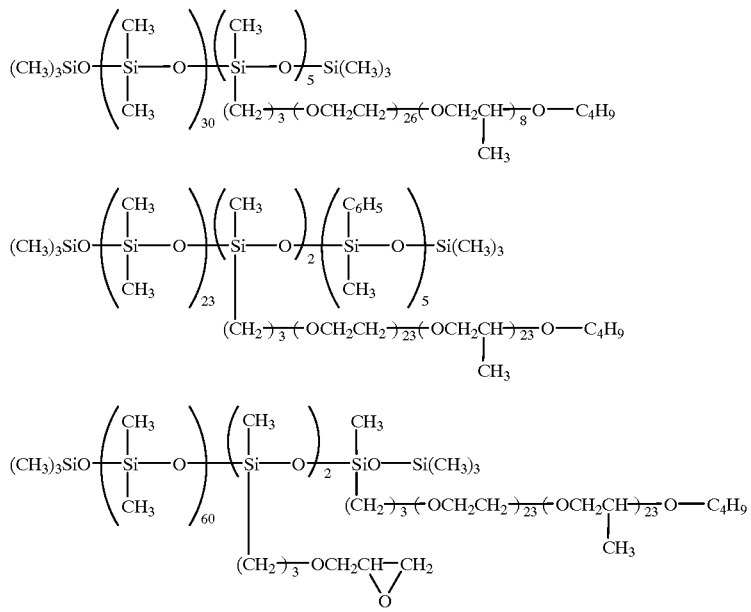

-continued

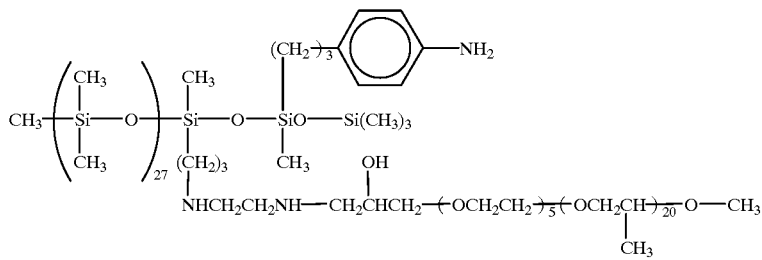

In the embodiment wherein the polyether-modified organopolysiloxane compound is used as a compatibilizing agent, there may be used in combination another organopolysiloxane compound such as an amino-modified organopolysiloxane or epoxy-modified organopolysiloxane containing an amino functional group or epoxy functional group attached to a silicon atom at an end or intermediate of a molecular chain as shown below.

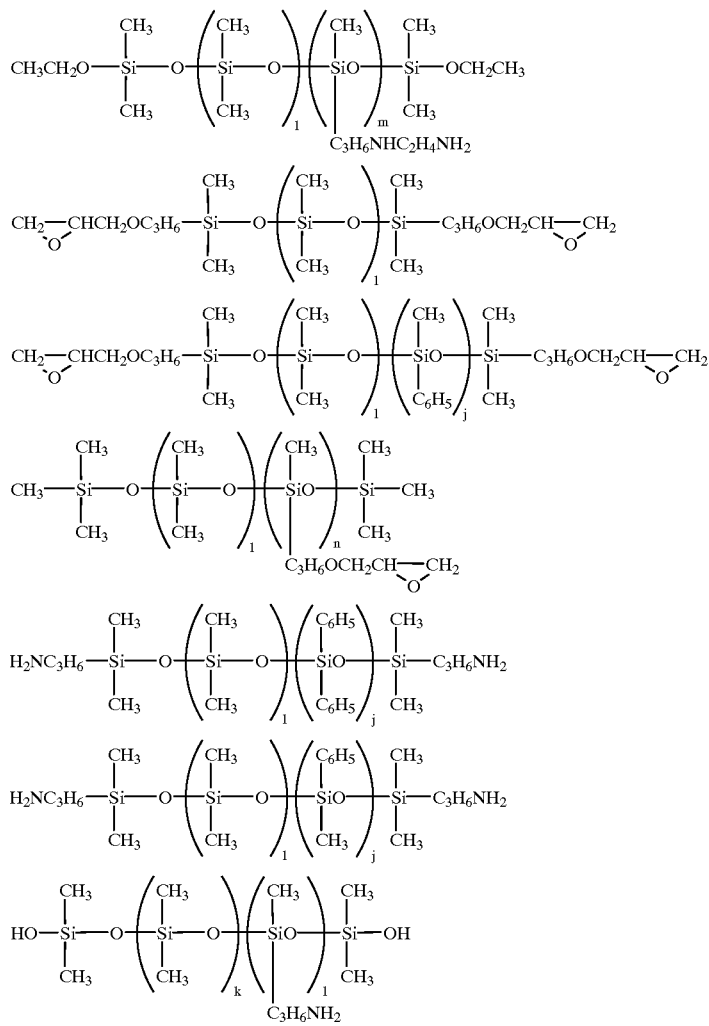

In the above formulae, letters i to n are integers, i is from 5 to 200, j is from 1 to 50, k is from 50 to 2000, λ is from 1 to 10, m is from 1 to 10, and n is from 1 to 10.

More illustrative, preferred examples of the amino-modified organopolysiloxane and epoxy-modified organopolysiloxane are given below.

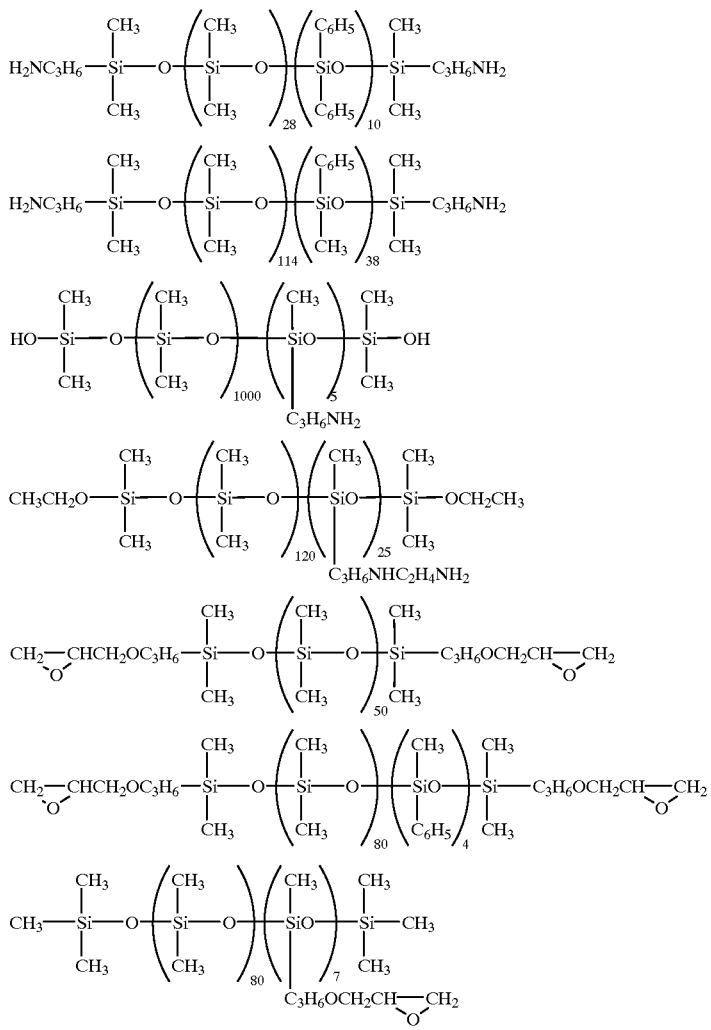

In the practice of the invention, the cured product of organopolysiloxane used as component (E) is not particularly limited. It may be properly selected from the following silicone rubbers and silicone resins. Included are organopolysiloxane rubbers cured through addition reaction in the presence of platinum catalysts from compositions comprising a vinyl-containing organopolysiloxane and an organohydrogenpolysiloxane; organopolysiloxane rubbers cured through condensation reaction from compositions comprising a terminal silanol and/or alkoxy group-blocked organopolysiloxane, a silane having at least three hydrolyzable functional groups in a molecule and/or a partial hydrolytic condensate thereof, and a condensation catalyst (the condensation reaction includes dehydration, dehydrogenation, dealcoholysis, oxime removal, amine removal, amide removal, carboxylic acid removal and ketone removal); organopolysiloxane rubbers vulcanized with organic peroxides; and organopolysiloxane rubbers cured by UV irradiation, as well as organopolysiloxane resins comprising $SiO_2$ units and/or $RSiO_{3/2}$ units cured by each of the aforementioned reactions wherein R is a monovalent hydrocarbon group. Examples of R are the same as the monovalent hydrocarbon groups having 1 to 10 carbon atoms of $R^1$ described above except the substituted hydrocarbon groups. These organopolysiloxane cured products are finely divided into powder by a suitable pulverizer before use. The organopolysiloxane cured products used herein may have a functional group such as silanol, hydroxy, carboxy, vinyl, amino, mercapto, epoxy, methoxy or ethoxy group in their structure. From the molding standpoint, the organopolysiloxane cured products used herein should preferably have a mean particle size of up to about 50 μm, more preferably about 0.01 to 50 μm, most preferably about 0.1 to 20 μm because the molds used in the molding of ICs and other electronic parts are currently reduced in gate size as the packages become more compact and thinner.

The organopolysiloxane or cured product thereof (E) is preferably added in an amount of about 0.1 to 10 parts, more preferably about 0.1 to 5 parts, especially about 0.5 to 2 parts by weight per 100 parts by weight of the epoxy resin, phenolic resin, and polyimide resin combined. Less than 0.1 part of the organopolysiloxane would be less effective for imparting flame retardancy whereas more than 10 parts would detract from mechanical strength.

If desired, the epoxy resin composition of the invention may contain a stress-releasing agent insofar as flame retardancy is not adversely affected. Such stress-releasing agents include well-known silicone-modified epoxy resins, silicone-modified phenolic resins, and thermoplastic resins of methyl methacrylate/butadiene/styrene.

The flame retardant epoxy resin composition of the invention may further contain a diluent for the purpose of reducing viscosity. The diluent may be selected from well-known ones, such as n-butylglycidyl ether, phenylglycidyl ether, styrene oxide, t-butylphenylglycidyl ether, dicyclopentadiene diepoxide, phenol, cresol, and t-butylphenol.

Other additives which can be added to the epoxy resin composition of the invention include coupling agents such as silane coupling agents, titanium coupling agents, and aluminum coupling agents; coloring agents such as carbon black; wetting modifiers and antifoaming agents such as nonionic surfactants, fluorinated surfactants, and silicone oil.

Insofar as the objects and advantages of the invention are not impaired, a halogen-trapping agent for trapping liberated halogen may be added in an amount of less than about 10% by weight, especially about 1 to 5% by weight of the entire composition.

The flame retardant epoxy resin composition of the invention is substantially free of antimony compounds such as antimony trioxide and bromine compounds such as brominated epoxy resins. By the term "substantially free" it is meant that the content of such flame retardants in the composition is from 0 to 1%, preferably from 0 to 0.1% by weight.

The composition of the invention can be prepared by uniformly mixing the above-mentioned essential and optional components in a high-speed mixer or the like and then thoroughly milling in a twin-roll mill or continuous kneader. The milling temperature is desirably from about 50° C. to about 110° C. After milling, the mixture is sheeted, cooled, and comminuted, obtaining an end epoxy resin composition.

The epoxy resin compositions of the invention are applicable as versatile molding materials and advantageously used for the encapsulation of semiconductor devices. The semiconductor devices of interest are devices required to be heat resistant such as integrated circuits with substantial heat release and devices required to be highly reliable. The compositions are especially advantageous in encapsulating high-speed storages and CPU.

The composition can be molded by any conventional molding techniques although transfer molding is usually preferable. Appropriate molding conditions include about 165 to 185° C. and 1 to 3 minutes.

Even in the absence of bromine compounds and antimony compounds, the epoxy resin compositions of the invention cure into products exhibiting high flame retardancy and high-temperature reliability.

EXAMPLE

Examples of the invention are given below by way of illustration and not by way of limitation. All parts are by weight.

Preparation Example 1

A flask equipped with a stirrer, thermometer, and nitrogen supply conduit was charged with 109 grams (0.5 mol) of pyromellitic dianhydride and 161 grams (0.5 mol) of 3,3,4,4-benzophenonetetracarboxylic dianhydride as tetracarboxylic dianhydride components and 2,000 grams of N-methyl-2-pyrrolidone (NMP) as a solvent. To the flask, 200 grams (1 mol) of 4,4-diaminodiphenyl ether as a diamine component in 660 grams of NMP was added dropwise at a controlled rate such that the temperature of the system did not exceed 40° C.

After the completion of addition, the contents were stirred for 10 hours at room temperature. After the flask was equipped with a reflux condenser having a water trap, 100 grams of xylene was added. The reaction system was heated to 180° C. and held at the temperature for 6 hours. During the period, a precipitate formed in the system and the reaction yielded 36 grams of water.

After 6 hours of reaction, the reactor was cooled to room temperature whereupon the precipitate was recovered, washed with methanol, and dried in vacuum, obtaining 430 grams of a polyimide resin in powder form.

The thus recovered resin was analyzed by IR absorption spectroscopy. An absorption peak attributable to polyamic acid was not observed, but absorption peaks attributable to an imide group were observed at 1780 cm$^{-1}$ and 1720 cm$^{-1}$.

The polyimide resin had a structure in which $R^2$ is a mixture of

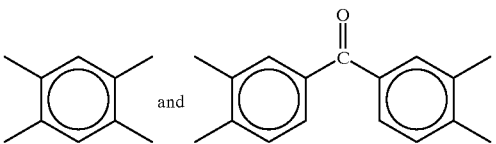

in a molar ratio of 1:1 and $R^3$ is

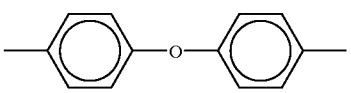

in formula (2) defined previously. The resin was measured for molecular weight by gel permeation chromatography using dimethylacetamide solvent, finding a weight average molecular weight of 84,000 on a polystyrene basis. The polyimide resin had a softening point of 280° C.

Preparation Example 2

In accordance with the procedure of Preparation Example 1, a polyimide resin solution was obtained using 288 grams (0.98 mol) of 3,3,4,4-biphenyltetracarboxylic dianhydride as a tetracarboxylic dianhydride component, 74.6 grams (0.3 mol) of 1,3-bis(3-aminopropyl)-1,1,3,3-tetramethyldisiloxane and 287.4 grams (0.7 mol) of 2,2-bis [4-(4-aminophenoxy)-phenyl]propane as diamine components, 6 grams (0.04 mol) of phthalic anhydride as a molecular weight modifier, and 2,600 grams of NMP as a solvent. The solution was poured into 5 liters of methanol whereupon a precipitate settled out. Vacuum drying yielded 615 grams of the end polyimide resin.

The polyimide resin had a structure in which $R^2$ is

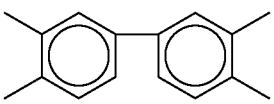

and $R^3$ is a mixture of

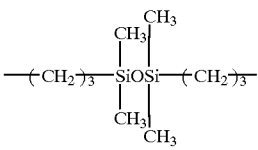

and

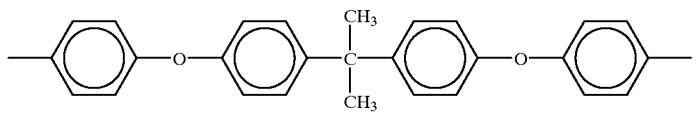

in a molar ratio of 3:7 in formula (2) defined previously.

The resin had a weight average molecular weight of 48,000 and a softening point of 240° C.

Preparation Example 3

In accordance with the procedure of Preparation Example 1, a polyimide resin solution was obtained using 310 grams (1 mol) of 3,3,4,4-oxydiphthalic dianhydride as a tetra-carboxylic dianhydride component, 84 grams (0.1 mol) of a diaminosiloxane of the structural formula shown below and 194 grams (0.9 mol) of 3,3'-dihydroxy-4,4'-diaminobiphenyl as diamine components, and 2,350 grams of NMP as a solvent. The solution was poured into 5 liters of methanol whereupon a precipitate settled out. Vacuum drying yielded 540-grams of the end polyimide resin.

The polyimide resin had a structure in which $R^2$ is

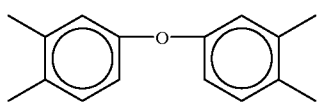

and $R^3$ is a mixture of

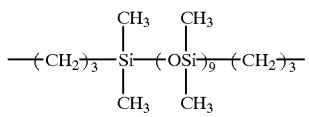

and

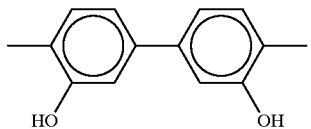

in a molar ratio of 1:9 in formula (2) defined previously.

The resin had a weight average molecular weight of 22,000 and a softening point of 190° C.

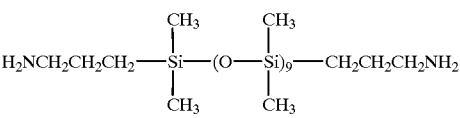

Examples 1–10

Comparative Examples 1–4

The components shown in Table 1 were uniformly melted and milled in a hot twin-roll mill. The resulting compounds were cooled and comminuted, obtaining epoxy resin compositions for semiconductor encapsulation.

TABLE 1

| Composition (pbw) | Example | | | | | | | | | | Comparative Example | | | |
|---|---|---|---|---|---|---|---|---|---|---|---|---|---|---|
| | 1 | 2 | 3 | 4 | 5 | 6 | 7 | 8 | 9 | 10 | 1 | 2 | 3 | 4 |
| Epoxy resin A | — | — | — | — | — | — | — | — | — | 5.0 | 58.2 | — | — | — |
| Epoxy resin B | 46.3 | — | — | — | 15 | 15 | 46.3 | 46.3 | 46.3 | — | — | 43.2 | 46.6 | 46.6 |
| Epoxy resin C | — | — | — | 55.3 | — | — | — | — | — | — | — | — | — | — |
| Epoxy resin D | — | — | 46.7 | — | — | — | — | — | — | — | — | — | — | — |
| Epoxy resin E | — | 56.5 | — | — | 49.2 | 50.1 | — | — | — | 53.3 | — | — | — | — |
| Curing agent 1 | — | — | — | — | — | — | — | — | — | — | 41.8 | — | — | — |
| Curing agent 2 | — | — | — | — | — | — | — | — | — | — | — | 53.4 | — | — |
| Curing agent 3 | 53.7 | 43.5 | 53.3 | — | 25.0 | — | 53.7 | 53.7 | 53.7 | 41.7 | — | — | — | 53.7 |
| Curing agent 4 | — | — | — | — | — | 15.5 | — | — | — | — | — | — | — | — |
| Curing | — | — | — | 44.6 | 10.8 | 19.4 | — | — | — | — | — | 51.8 | — | — |

TABLE 1-continued

| Composition | Example | | | | | | | | | | Comparative Example | | | |
| --- | --- | --- | --- | --- | --- | --- | --- | --- | --- | --- | --- | --- | --- | --- |
| (pbw) | 1 | 2 | 3 | 4 | 5 | 6 | 7 | 8 | 9 | 10 | 1 | 2 | 3 | 4 |
| agent 5 | | | | | | | | | | | | | | |
| Polyimide (PE1) | — | — | 3 | — | — | — | — | — | — | 5 | — | — | — | — |
| Polyimide (PE2) | — | 5 | — | — | — | 10 | — | — | — | — | — | — | — | — |
| Polyimide (PE3) | 5 | — | — | 10 | 15 | — | 7 | 7 | 7 | — | — | — | — | 25 |
| Brominated epoxy resin | — | — | — | — | — | — | — | — | — | — | — | 5 | — | — |
| Fused silica | 850 | 800 | 850 | 800 | 790 | 800 | 850 | 850 | 850 | 850 | 750 | 800 | 850 | 850 |
| Fused silica in vol % | 80.9 | 80 | 80.9 | 80 | 79.9 | 80 | 80.9 | 80.9 | 80.9 | 80.9 | 78.9 | 80 | 80.9 | 80.9 |
| Antimony trioxide | — | — | — | — | — | — | — | — | — | — | — | 5 | — | — |
| Carbon black | 1.5 | 1.5 | 1.5 | 1.5 | 1.5 | 1.5 | 1.5 | 1.5 | 1.5 | 1.5 | 1.5 | 1.5 | 1.5 | 1.5 |
| Silane coupling agent | 1.0 | 1.0 | 1.0 | 1.0 | 1.0 | 1.0 | 1.0 | 1.0 | 1.0 | 1.0 | 1.0 | 1.0 | 1.0 | 1.0 |
| Carnauba wax | 1.2 | 1.2 | 1.2 | 1.2 | 1.2 | 1.2 | 1.2 | 1.2 | 1.2 | 1.2 | 1.2 | 1.2 | 1.2 | 1.2 |
| Triphenyl-phosphine | 0.8 | 0.8 | 0.8 | 0.8 | 0.8 | 0.8 | 0.8 | 0.8 | 0.8 | 0.8 | 0.8 | 0.8 | 0.8 | 0.8 |
| Organopoly-siloxane A | — | — | — | — | — | — | 0.2 | 0.5 | 0.8 | — | — | — | — | — |
| Organopoly-siloxane B | — | — | — | — | — | 0.5 | — | — | — | — | — | — | — | — |
| Organopoly-siloxane C | — | — | — | — | — | — | — | — | — | 0.5 | — | — | — | — |

The components shown in Table 1 are shown below.

Epoxy resin A
EOCN 1020 by Nippon Kayaku K. K.
epoxy equivalent: 195
SP$^2$ type carbon: 57.1%

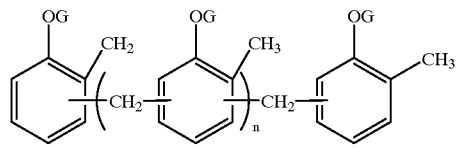

n is such a number as to give the above epoxy equivalent.
Epoxy resin B
YX 4000 HK
epoxy equivalent: 190
SP$^2$ type carbon: 54.5%

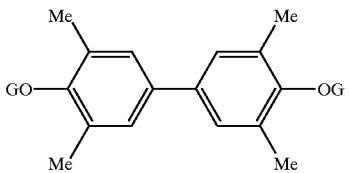

Epoxy resin C
epoxy equivalent: 262
SP$^2$ type carbon: 76%

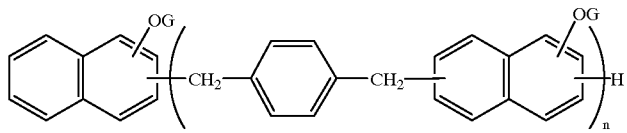
n is such a number as to give the above epoxy equivalent.
Epoxy resin D
epoxy equivalent: 193
Sp$^2$ type carbon: 58.3%
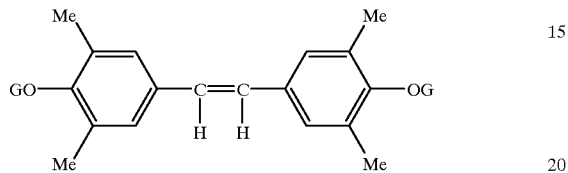
Epoxy resin E
epoxy equivalent: 286
SP$^2$ type carbon: 76.5%
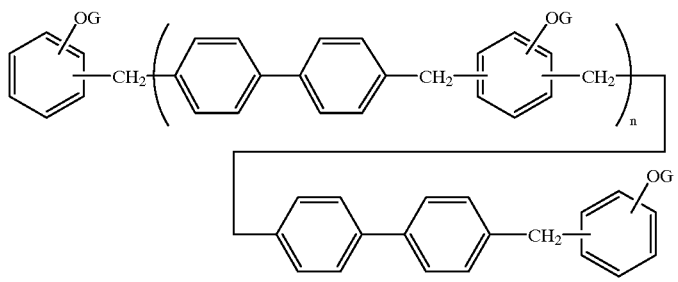
G: glycidyl, Me: methyl, n=1.2
Curing agent 1
hydroxyl equivalent: 112
SP$^2$ type carbon: 89.5%
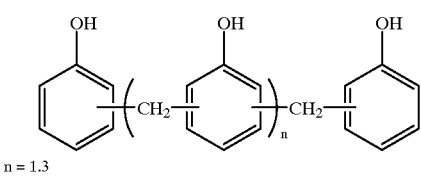
n = 1.3
Curing agent 2
hydroxyl equivalent: 174
SP$^2$ type carbon: 57.4%
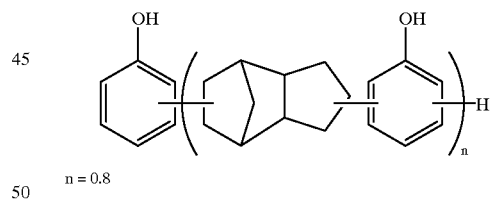
n = 0.8
Curing agent 3
hydroxyl equivalent: 198
SP$^2$ type carbon: 91.5%

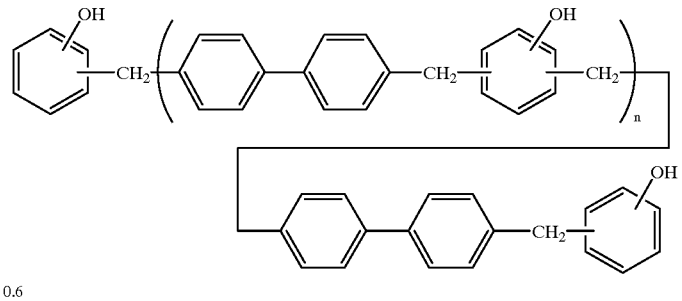

n = 0.6

Curing agent 4
hydroxyl equivalent: 197
SP$^2$ type carbon: 92.8%

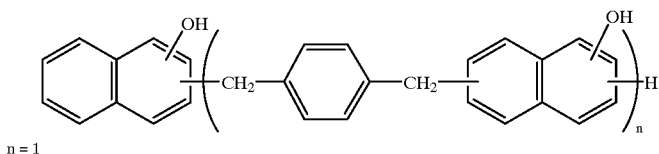

n = 1

Curing agent 5
hydroxyl equivalent: 169
SP$^2$ type carbon: 88%

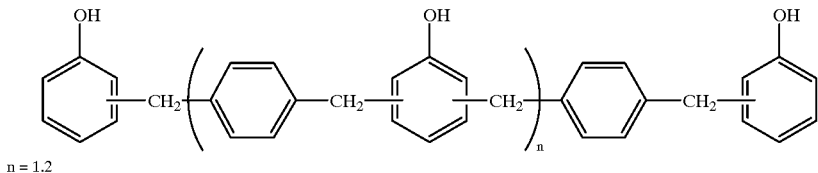

n = 1.2

Polyimides (PE1) to (PE3) correspond to the polyimide resins of Preparation Examples 1 to 3, respectively.

Brominated epoxy resin
BREN-S by Nippon Kayaku K. K.
epoxy equivalent: ~280

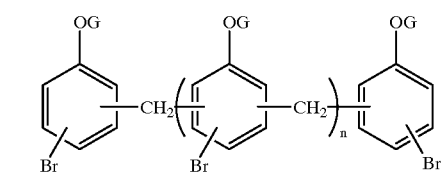

n = ~4 (average), G: glycidyl

Fused silica
spherical fused silica
mean particle size: 16 μm
specific surface area (BET): 1.9 m$^2$/g
a fraction of particles with a diameter of at least 75 μm: up to 0.5% by weight Silane coupling agent
KBM403 by Shin-Etsu Chemical Co., Ltd.
γ-glycidoxypropyltrimethoxysilane
Organopolysiloxane A
KF96 by Shin-Etsu Chemical Co., Ltd.
linear dimethylpolysiloxane blocked with a trimethylsilyl group at each end of its molecular chain
Organopolysiloxane B

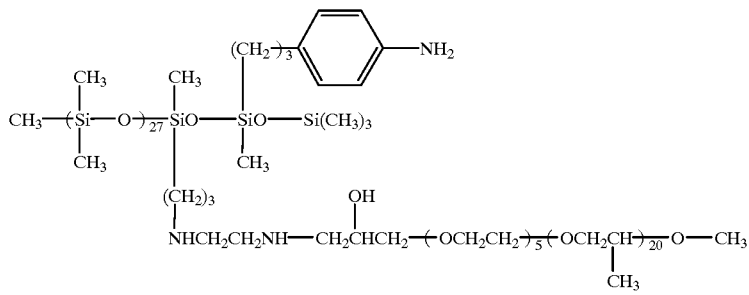

Organopolysiloxane C

KF54 by Shin-Etsu Chemical Co., Ltd.

linear methylphenylpolysiloxane

These compositions were examined by the following tests. The results are shown in Table 2.

(1) Spiral flow

Using a mold as prescribed by the EMMI standard, spiral flow was measured under conditions: 175° C., 70 kg/cm$^2$ and a molding time of 120 seconds.

(2) Gelling time

The gelling time of a composition was measured on a hot plate at 175° C.

(3) Molded hardness

A test bar of 10×4×100 mm was molded at 175° C. and 70 kg/cm$^2$ for 120 seconds according to JIS K-6911. The bar was measured for hardness by a Barcol hardness tester while being hot.

(4) Flame retardancy

A test piece of 1/16 inch thick was molded, post cured at 175° C. for 5 hours, and subjected to the test procedure set forth in Underwriters' Laboratories, Inc. Bulletin 94, Burning test for classifying materials (UL-94). Based on UL-94 V-0, the total burning time of a first burning time plus a second burning time was determined.

(5) High-temperature reliability

A dummy element having aluminum electrodes formed on a silicon chip and a partially gold-plated 42 alloy frame were bonded with gold wires having a diameter of 30 μm. An epoxy resin composition was molded over this assembly at 175° C. and 70 kgf/cm$^2$ for 120 seconds, obtaining a 14-pin DIP. The thus molded package was post cured at 180° C. for 4 hours and then left to stand in a drier at 200° C. for a preselected time (0 hour, 96 hours, 300 hours, 600 hours, 800 hours, and 1,000 hours). After the cured resin was dissolved away in fuming nitric acid, the bonded portion on the chip side was measured for shear strength.

TABLE 2

| Property | Example | | | | | | | | | | Comparative Example | | | |
|---|---|---|---|---|---|---|---|---|---|---|---|---|---|---|
| | 1 | 2 | 3 | 4 | 5 | 6 | 7 | 8 | 9 | 10 | 1 | 2 | 3 | 4 |
| Spiral flow (cm) | 95 | 80 | 97 | 78 | 86 | 82 | 98 | 103 | 105 | 76 | 32 | 93 | 98 | 31 |
| Gelling time (sec) | 21 | 19 | 20 | 18 | 19 | 18 | 20 | 21 | 20 | 18 | 16 | 19 | 20 | 17 |
| Molded hardness | 70 | 75 | 65 | 72 | 73 | 75 | 70 | 70 | 68 | 75 | 80 | 72 | 54 | 15 |
| Flame retardance, total burning time (sec) | 35 | 30 | 38 | 35 | 29 | 28 | 28 | 27 | 29 | 27 | 105 | 21 | burning | 25 |
| Shear strength (g) after 200° C. aging  0 hr. | 40 | 45 | 38 | 43 | 40 | 37 | 40 | 39 | 41 | 42 | *1 | 38 | *2 | *3 |
| 96 hr. | 38 | 43 | 40 | 37 | 41 | 41 | 42 | 35 | 39 | 39 | | 9 | | |
| 300 hr. | 34 | 38 | 32 | 40 | 38 | 36 | 39 | 38 | 40 | 38 | | 8 | | |
| 600 hr. | 39 | 39 | 36 | 35 | 35 | 39 | 35 | 33 | 38 | 32 | | 7 | | |
| 800 hr. | 35 | 40 | 30 | 30 | 32 | 28 | 37 | 37 | 35 | 35 | | 5 | | |
| 1000 hr. | 32 | 35 | 32 | 28 | 31 | 30 | 31 | 28 | 30 | 28 | | 6 | | |

*1, *2: not tested because of rejection in UL94 V-0 burning test.
*3: not tested because of marked wire deformation upon package molding Japanese Patent Application No. 103959/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What is claimed is:

1. A flame retardant epoxy resin composition comprising
(A) an epoxy resin having an epoxy equivalent of at least 185 and possessing a skeleton having in its molecular structure at least one structure in which two benzene rings are conjugable to each other directly or via an aliphatic unsaturated double bond, carbon atoms having an atomic orbital of SP$^2$ type accounting for at least 50% of the total number of carbon atoms in the epoxy resin,
(B) a phenolic resin having a hydroxyl equivalent of at least 160, carbon atom,, having an atomic orbital of SP$^2$ type accounting for at least 85% of the total number of carbon atoms in the phenolic resin,
(C) a polyimide resin having one of the following formulae (2) or (3) as a main constituent unit:

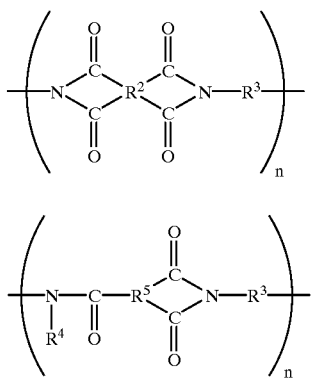

(2)

(3)

wherein $R^2$ is a tetravalent organic group of 6 to 30 carbon atoms containing one or more aromatic rings or aromatic heterocyclic rings, $R^3$ is a divalent organic group of 6 to 30 carbon atoms containing one or more aromatic rings and/or a divalent organic group which is an aliphatic diamine residue containing a siloxane structure, $R^4$ is a hydrogen atom or an alkyl group of 1 to 4 carbon atoms, $R^5$ is a trivalent organic group of 6 to 20 carbon atoms containing one or more aromatic rings or aromatic heterocyclic rings and n is a number such that the polyimide resin has a weight average molecular weight of about 5,000 to about 300,000, in an amount of 1 to 20 parts by weight per 100 parts by weight of the epoxy resin and the phenolic resin combined, and (D) at least 70% by volume of the entire composition of an inorganic filler, said composition being substantially free of bromine compounds and antimony compounds.

2. The flame retardant epoxy resin composition of claim 1 further comprising (E) an organopolysiloxane of the following average compositional formula (1):

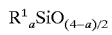 (1)

wherein $R^1$ is substituted or unsubstituted monovalent hydrocarbon group and letter a is a positive number of from 1 to 3, or a cured product thereof, in an amount of 0.1 to 10 parts by weight per 100 parts by weight of components (A), (B), and (C) combined.

3. A semiconductor device which is encapsulated with a flame retardant epoxy resin composition according to claim 1.

4. A semiconductor device which is encapsulated with a flame retardant epoxy resin composition according to claim 2.

5. The flame retardant epoxy resin composition of claim 1, wherein $R^3$ in formula (2) and (3) is an aliphatic diamine residue containing a siloxane structure having the following formula:

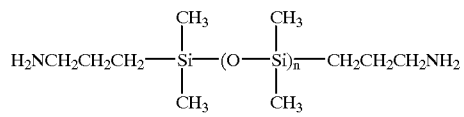

wherein n is an integer of 1 to 100.

6. A semiconductor device which is encapsulated with a flame retardant epoxy resin composition according to claim 5.

7. The flame retardant epoxy resin composition of claim 1, wherein the epoxy resin (A) has at least one biphenyl structure, naphthalene ring or two benzene rings bonded together by a —CH=CH— chain.

8. The flame retardant epoxy resin composition of claim 1, wherein in the epoxy resin (A) carbon atoms having an atomic orbital of $SP^2$ type account for 54 to 95 % of the total number of carbon atoms in the epoxy resin.

9. The flame retardant epoxy resin composition of claim 1, wherein in the epoxy resin (A) is of one of the following structures:

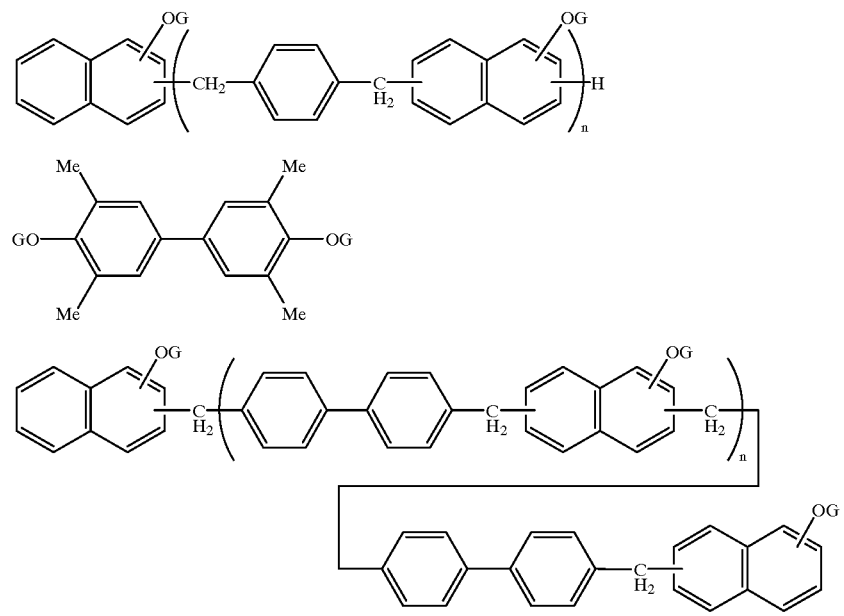

-continued

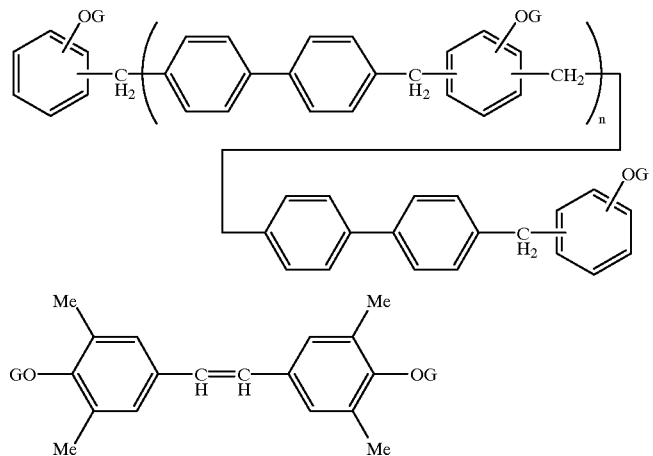

wherein G stands for a glycidyl group, Me stands for a methyl group, and n is a positive number such that the resin has an epoxy equivalent of 185 to 1,000.

10. The flame retardant epoxy resin composition of claim 1, wherein the composition contains an epoxy resin other than epoxy resin (A) in an amount up to 30% by weight of the overall epoxy resins in the composition.

11. The flame retardant epoxy resin composition of claim 1, wherein the phenolic resin (B) has a phenolic hydroxyl equivalent of 190 to 500.

12. The flame retardant epoxy resin composition of claim 1, wherein in the phenolic resin (b) is of one of the following structures:

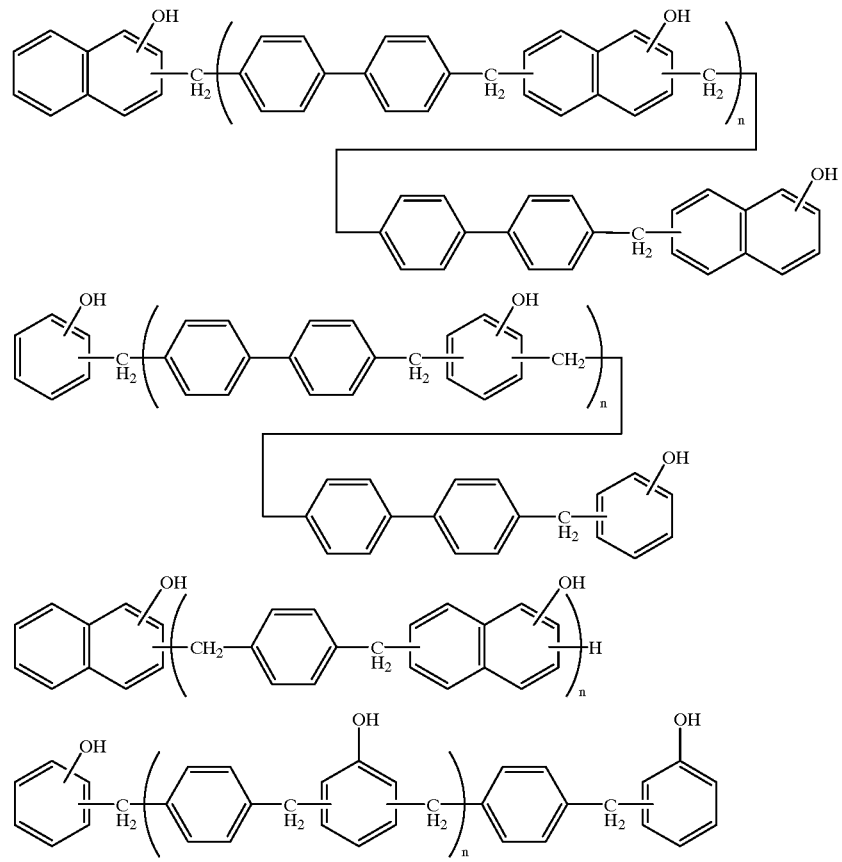

wherein n is a positive number such that the resin has a phenolic hydroxyl equivalent of 160 to 1,000.

13. The flame retardant epoxy resin composition of claim 1, wherein the composition contains a phenolic resin other than phenolic resin (B) in an amount up to 20% by weight of the overall phenolic resins in the composition.

14. The flame retardant epoxy resin composition of claim 1, wherein the relative amounts of epoxy resins and phenolic resins in the composition are such that about 0.6 to 1.3 mol of epoxy groups are available per mole of phenolic hydroxyl group.

15. The flame retardant epoxy resin composition of claim 1, wherein n in formulae (2) and (3) is such that the polyimide resin has a weight average molecular weight of about 5,000 to about 300,000.

16. The flame retardant epoxy resin composition of claim 1, wherein in the formulae (2) and (3), each $R^2$ is independently selected from the following formulae:

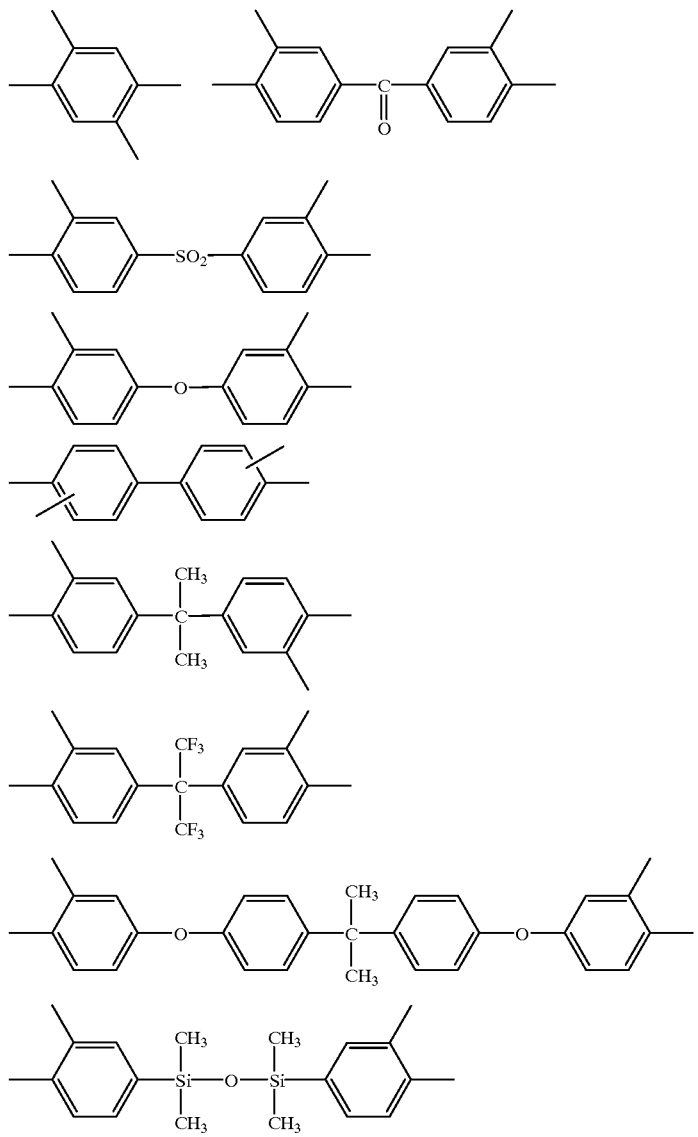

$R^3$ is independently selected from the following formulae:

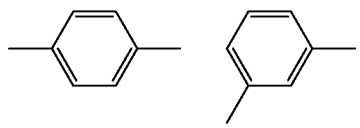

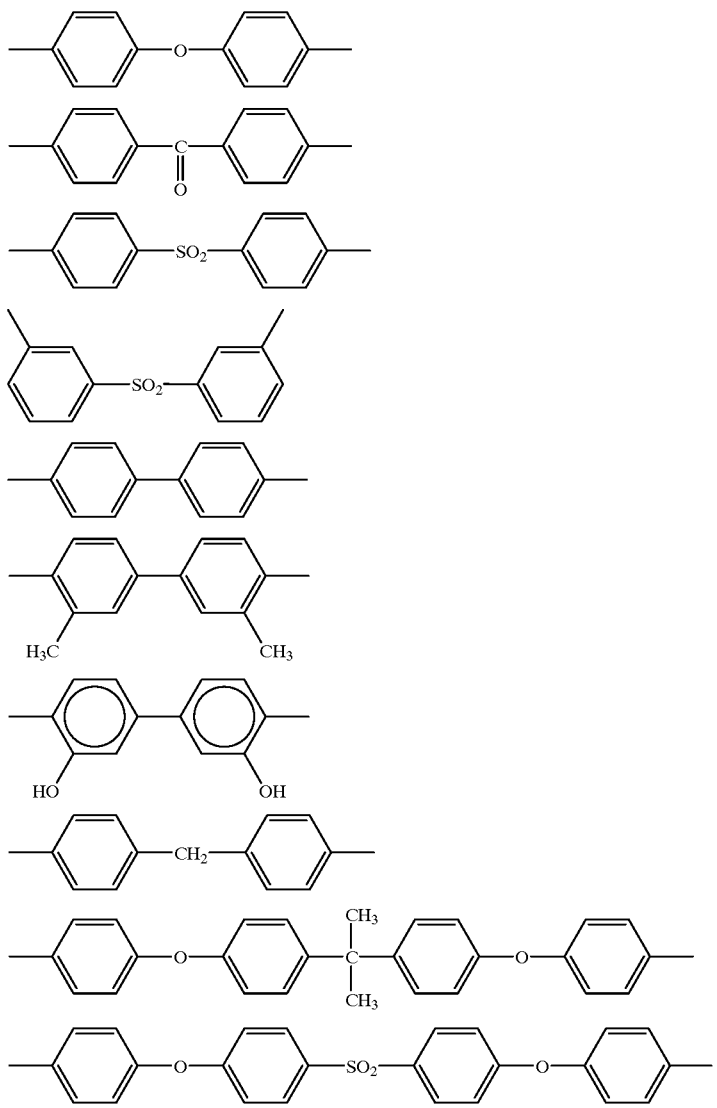

and $R^5$ is independently selected from the following formulae:

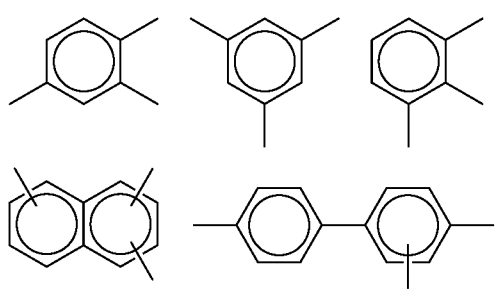

17. The flame retardant epoxy resin composition of claim 1, wherein the inorganic filler (D) is selected from the group consisting of spherical silica obtained by flame fusion, spherical silica produced by a sol-gel process, crystalline silica, alumina, boron nitride, aluminum nitride, silicon nitride, magnesia, magnesium silicate and mixtures thereof.

18. The flame retardant epoxy resin composition of claim 1, wherein the inorganic filler (D) is provided in an amount of 70 to 85% by volume of the entire composition.

19. The flame retardant epoxy resin composition of claim 1, wherein the inorganic filler (D) has an average particle size of 4 to 30 μm.

20. The flame retardant epoxy resin composition of claim 1, wherein the inorganic filler (D) has 0.5 to 10% by weight of a fine filler having a mean particle size of 0.5 μm or less.

* * * * *